United States Patent [19]

Godbey et al.

[11] Patent Number: 5,013,681

[45] Date of Patent: May 7, 1991

[54] METHOD OF PRODUCING A THIN SILICON-ON-INSULATOR LAYER

[75] Inventors: David J. Godbey, Bethesda; Harold L. Hughes, West River; Francis J. Kub, Severna Park, all of Md.

[73] Assignee: The United States of America as represented by the Secretary of the Navy, Washington, D.C.

[21] Appl. No.: 414,225

[22] Filed: Sep. 29, 1989

[51] Int. Cl.⁵ .............................................. H01L 21/20
[52] U.S. Cl. ....................................... 437/86; 437/26; 437/62; 437/83; 437/132; 437/974
[58] Field of Search ................... 148/DIG. 12, 51, 58, 148/59, 72, 135, 152, 33, 33.3, 33.4; 156/610–615, 655, 657, 662; 357/49, 54; 437/24, 26, 62, 83, 81, 86, 126, 132, 247, 915, 974

[56] References Cited

U.S. PATENT DOCUMENTS

| | | | |
|---|---|---|---|
| 3,721,588 | 3/1973 | Hays | 437/86 |
| 3,959,045 | 5/1976 | Antypas | 437/86 |
| 3,976,511 | 8/1976 | Johnson | 357/49 |
| 3,997,381 | 12/1976 | Wanlass | 156/3 |
| 4,116,751 | 9/1978 | Zaromb | 437/86 |
| 4,142,925 | 3/1979 | King et al. | 156/657 |
| 4,226,649 | 10/1980 | Davey et al. | 437/86 |
| 4,230,505 | 10/1980 | Wu et al. | 437/86 |
| 4,255,208 | 3/1981 | Deutscher et al. | 156/612 |
| 4,292,730 | 10/1981 | Ports | 437/86 |
| 4,325,073 | 4/1982 | Hughes et al. | 357/22 |
| 4,599,792 | 7/1986 | Cade et al. | 437/86 |
| 4,601,779 | 7/1986 | Abernathey et al. | 156/628 |
| 4,649,627 | 3/1987 | Abernathey et al. | 437/86 |
| 4,851,078 | 7/1989 | Short et al. | 437/62 |
| 4,875,086 | 10/1989 | Malhi et al. | 357/54 |
| 4,891,329 | 1/1990 | Reisman et al. | 437/86 |
| 4,959,328 | 9/1990 | Behr et al. | 437/86 |

FOREIGN PATENT DOCUMENTS

| | | | |
|---|---|---|---|
| 0065648 | 3/1988 | Japan | 437/86 |
| 0215041 | 8/1989 | Japan | 437/62 |
| 1226167 | 9/1989 | Japan | 437/62 |

OTHER PUBLICATIONS

Kimura et al., "Single Crystal Si Film on an Insulating Substrate," Appl. Phys. Lett., 43(3), 1 Aug. 1983, pp. 263-265.

Maszera et al., "Bonding of Silicon Wafers for Silicon-on-Insulator," J. Appl. Phys., vol. 64, No. 10, Pt. 1, 15 Nov. 1988, pp. 4943-4950.

Primary Examiner—Olik Chaudhuri
Assistant Examiner—William D. Bunch
Attorney, Agent, or Firm—Thomas E. McDonnell; Peter T. Rutkowski; Lawrence A. Root

[57] ABSTRACT

A process for fabricating thin film silicon wafers using a novel etch stop composed of a silicon-germanium alloy includes properly doping a prime silicon wafer for the desired application, growing a strained $Si_{1-x}Fe_x$ alloy layer onto seed wafer to serve as an etch stop, growing a silicon layer on the strained alloy layer with a desired thickness to form the active device region, oxidizing the prime wafer and a test wafer, bonding the oxide surfaces of the test and prime wafers, machining the backside of the prime wafer and selectively etching the same to remove the silicon, removing the strained alloy layer by a non-selective etch, thereby leaving the device region silicon layer. In an alternate embodiment, the process includes implanting germanium, tin or lead ions to form the strained etch stop layer.

19 Claims, 3 Drawing Sheets

METHOD OF PRODUCING A THIN SILICON-ON-INSULATOR LAYER

BACKGROUND OF THE INVENTION

1. Field Of The Invention

This invention is directed to a method of forming a silicon-on-insulator structure and more particularly to the formation of such a structure using a novel etch stop comprising a silicon-germanium alloy.

2. Background Description

In the present era of very large scale integration (VLSI), in which the dimensions of transistors and other semiconductor structures are shrinking below one micrometer, a host of new problems must be addressed. In general, greater isolation is required between devices. For CMOS applications, this isolation must prevent latch-up. At the same time, this increased isolation must not be provided at the expense of available chip space.

Silicon-on-insulator (SOI) technology appears to be a particularly promising method of addressing this problem. Silicon-on-insulator substrates are in use for the fabrication of devices that are high speed, resistant to latch up, and are radiation hard.

Separation by Implanted oxygen (SIMOX) has been the most thoroughly studied SOI system to date to replace silicon on sapphire. A general example of this technology is shown in the article by R. J. Lineback, "Buried Oxide Marks Route to SOI Chips", *Electronics Week*, Oct, 1, 1984, pp. 11-12. As shown in this article, oxygen ions are implanted into a bulk silicon to form a buried oxide layer therein. The implant is then annealed for two hours so that portion of the silicon lying above the buried oxide is single-crystal silicon. The various semiconductor devices are then formed on the single-crystal layer. The underlying buried oxide provides isolation between adjacent devices and the substrate region.

Although SIMOX is a promising technology, threading dislocations generated by the implantation in the active device region limit the performance of the material. In addition, the buried oxide is of poor quality resulting in back channel leakage.

Bond and etch back silicon-on-insulator (BESOI) technology, as an alternative to SIMOX, has the advantage of a cleaner oxide/silicon interface with less defects and charge trapping states at the buried oxide. This material is generated by oxidizing the seed and/or handle wafers, followed by bonding the two wafers. The active device region is generated on the seed wafer by lapping and etching to the desired film thickness. Although this technology is suitable for the fabrication of 600 nm SOI, the presence of an etch stop is essential to achieve SOI wafers with a nominal thickness of 500 nm or less.

Heavily doped boron regions placed by diffusion or implantation into the silicon have been reported to make an effective etch stop, and CMOS devices fabricated from these materials have been reported. Silicon membrane technology uses similar techniques to fabricate these materials. The limitations inherent in the utilization of boron is that boron is a p-type dopant in silicon. Both implantation and diffusion of boron results in residual p doping of the silicon film. Also, boron incorporated by ion implantation and annealing results in the generation of threading dislocations in the device region. This limits performance of devices made from these materials.

SUMMARY OF THE INVENTION

Accordingly, it is an object of the invention to provide an improved silicon-on-insulator (SOI) fabrication process.

It is another object of the invention to provide a silicon-on-insulator process by which the thickness of the final silicon layer is substantially uniform and defect free.

It is yet another object of the invention to provide an improved silicon-on-insulator fabrication process in which the etching of the final silicon layer may be more precisely controlled without leaving residual dopants and defects in the final silicon layer.

It is a further object of this invention to generate SOI wafers with a nominal thickness of 500 nm or less.

These and other objects of the invention are realized in a process of forming a thin silicon-on-insulator structure having a defect free device regions. A strained etch-stop layer is formed upon a silicon substrate, wherein the etch-stop layer consists of a silicon-germanium alloy. After a silicon cap layer is formed upon the strained etch-stop layer, the silicon cap layer is bonded to a mechanical substrate. Finally the silicon substrate and the strained etch stop layers are removed without removing underlaying portions of the silicon cap layer, whereby the underlaying portions of the silicon cap layer remain on the mechanical substrate to form the thin semiconductor layer.

The advantages of this invention over the old methods is that the etch stop is grown into the wafer using techniques such as molecular beam epitaxy or chemical vapor deposition thereby minimizing the introduction of defects. No implantation step is necessary, although an alternative method for generating the etch stop layer is by ion implantation of germanium. In addition, since germanium is not an electrically active dopant in silicon, no residual $p^-$ or $n^-$ doping is left behind following processing. Other objects, features and advantages of the invention will be apparent to those skilled in the art from the description of the preferred embodiment as described below and also recited in the appended claims.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DESCRIPTION OF THE PREFERRED EMBODIMENT

A solution to the problems detailed in the Background of The Invention is the use of an as-grown $Si_{1-x}Ge_x$ alloy strained layer as an etch stop in the fabrication of thin film silicon utilizing bond-and-etchback silicon-on-insulator (BESOI) technology.

In this process, a strained layer silicon-germanium alloy is grown on a silicon substrate, followed by a silicon cap of variable thickness. This cap is the region where devices will be built following bonding, thinning, and etch back, hence it is important that the cap is left defect and impurity free.

Figure 1:
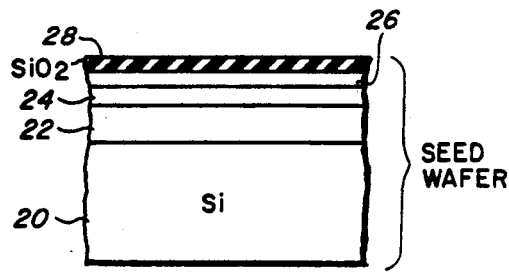
FIG. 1 is an illustration of a seed wafer.

Referring now to the drawings and more particularly to FIG. 1, a silicon seed wafer with an incorporated etch stop is prepared as follows. First a silicon wafer 20, p or n doped, is cleaned chemically using a standard cleaning procedure. The cleaned wafer 20 is then loaded into a system capable of growing epitaxial silicon or germanium. Both molecular beam epitaxy (MBE) and chemical vapor deposition (CVD) are currently viable means of epitaxial growth. Following a brief degassing and loading of the wafer into the growth chamber, the silicon oxide present is removed in-situ by heating to 700°–1100° C., more preferably 750°–950° C., and most preferably 800°–900° C. Oxide removal is also possible by heating in a silicon flux, or by bombardment by noble gas ions.

A silicon buffer layer 22, is then grown on wafer 20. Although not required for this invention, the buffer layer 22 helps to obtain a smooth silicon surface with no pitting or holes. This buffer layer 22 is grown at approximately 650° C., with a thickness of 100Å–1μm thick. A preferred thickness for the buffer layer 22 is 300–500Å.

An etch stop layer 24 is then grown on the buffer layer 22. The etch stop layer 24 can be grown into the seed wafer by techniques such as molecular beam epitaxy or chemical vapor deposition. These growth techniques are well developed and generate a sharp silicon/alloy interface. The etch stop layer 24 may be a $Si_{1-x}Ge_x$ alloy, where x=0.1–0.5. More preferably x=0.20–0.4. In the preferred embodiment, the etch stop 24 is a $Si_{0.7}Ge_{0.3}$ alloy, and is grown at 400°–900° C., more preferably 500°–800° C., on the buffer layer 22. The thickness of the etch stop layer 24 is between 100–5000Å. A more preferred thickness is 200–700Å. The etch stop layer 24 may also be comprised of alloys consisting of silicon and other group IV elements such as tin and lead.

A silicon cap layer 26 is then grown on the silicon-germanium alloy layer 24 with a thickness of 200Å–1 μm. The silicon cap layer 26 is grown at 400°–900° C., more preferably 500°–800° C. The doping type and doping concentration of this epitaxial cap layer is determined by the device to be fabricated. With this invention, a silicon cap layer 26 can be grown as small as 10Å. However, with current technology, ¼–½μm is the practical limit. Following deposition, the seed wafer of FIG. 1 is cooled to room temperature and removed from the growth system.

Figure 2:
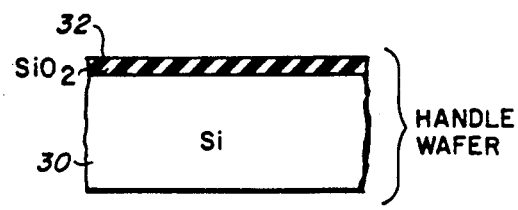
FIG. 2 is an illustration of a handle wafer.
Figure 3:
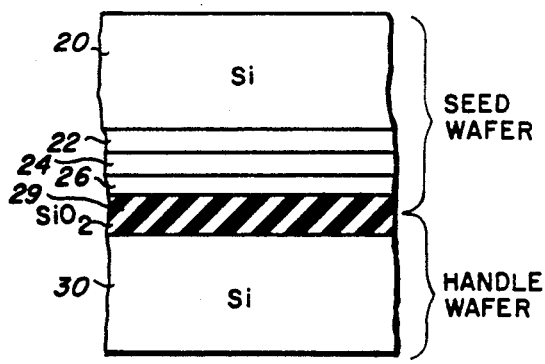
FIG. 3 is an illustration of the seed and handle wafers bonded together.

A handle wafer, illustrated in FIG. 2, is made by thermally oxidizing a surface of a silicon wafer 20 to form an SOI insulating layer 32 of $SiO_2$. A (100) face on the wafer 30 provides a good interface to $SiO_2$ and good anisotropic etch characteristics. The epitaxial layer 26 of the seed wafer is also oxidized to form insulating layer 28 thereupon. The seed wafer and the handle wafer are then placed on top of one another, as illustrated in FIG. 3, so that the insulating layers 28 and 32 are contacting to form insulating layer 29. Alternatively, either the seed wafer, of FIG. 1, or the handle wafer alone, of FIG. 2, could be oxidized to form the insulating layer 29 of FIG. 3. The thickness of the oxide layers 28 and 32 can vary depending on the thickness required to achieve isolation between the handle wafer and silicon cap layer 26. This will depend upon the ultimate device being fabricated from the SOI material.

Which of the seed and handle wafers is on top is immaterial. The seed wafer and the substrate wafer are then bonded by annealing the contacting wafers in an oxidizing atmosphere of either wet or dry oxygen at a temperature greater than approximately 700° C. Bonding at 700°–1000° C. in steam will yield a tightly bound pair. Alternative bonding techniques are described in U.S. Pat. No. 3,332,137 to Kenney and U.S. Pat. No. 3,959,045 to Antypas.

Figure 4:
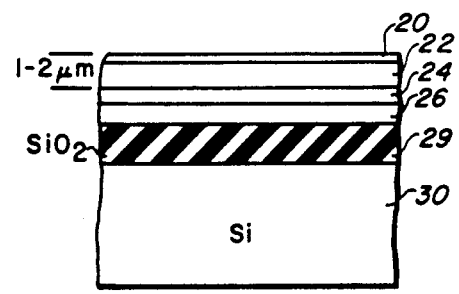
FIG. 4 is an illustration of the structure of FIG. 3 after lapping and polishing.

The Si region 20 of the bonded pair is now superfluous. Its primary use was for the formation and support of the epitaxial layer 26. The excess Si region 20 is removed by one of a variety of methods. For example, it can be mechanically removed by grinding and/or chemical polishing followed by an etching in hydrofluoric-nitric-acetic (HNA) solution. The use of HNA is discussed by Muraoka et al. in a chapter entitled "Controlled Preferential Etching Technology" appearing in the book "Semiconductor Silicon 1973". (Electrochemical Society, Princeton, N.J., eds. Huff and Burgess) at page 326. Thus the majority of the excess Si region 20 is removed leaving approximately 1–2 μm of silicon above the silicon-germanium alloy etch-stop layer 24, the cap layer 26, and the bulk region 30 separated by the insulating layer 29 as shown in FIG. 4. If the buffer layer 22 is not used, 1–2 μm of Si layer 20 will be left after etching and polishing. After polishing, the wafer of FIG. 4 is cleaned and placed into a strain sensitive etch bath. As illustrated in FIG. 4, the remaining silicon (1–2 μm), which includes the buffer layer 22 is removed by etching using a strain sensitive or selective etchant composed of, for example, 100 g. KOH, 4 g. $K_2Cr_2O_7$, and 100 mL propanol in 400 mL of water at 25° C. in a temperature controlled rotary etch system.

For example, the undoped silicon layer 20 and buffer layer 22 have been shown to etch at a rate of 17–20 nm/min. The as grown $Si_{0.7}Ge_{0.3}$ alloy has been shown to etch at a rate of 1 nm/min. with a selectivity of better than 17:1. Therefore, when the etch reaches the surface of the strained alloy layer 24, the etch rate slows considerably. With a 60 nm strained alloy layer 24, it takes about one hour for breakthrough of the etch stop region 24. Therefore, during the hour interval, the wafer must be removed from the selective etch before it etches all the way through to the cap layer 26.

Figure 5:
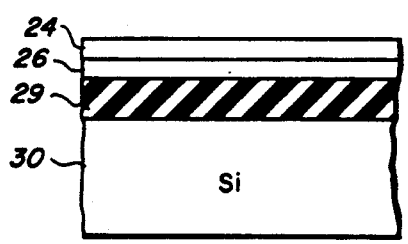
FIG. 5 is an illustration of the structure of FIG. 4 after selectively etching down to the silicon-germanium alloy layer.

Next the the structure of FIG. 5 is subjected to a second etch which will attack and selectively remove the silicon-germanium alloy layer 24. For example, the second etch may comprise ammonia, hydrogen peroxide, and water in a 1:1:4 ratio.

Figure 6:
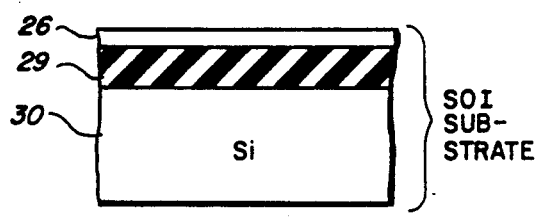
FIG. 6 is an illustration of an SOI structure of the preferred embodiment.

Afterwards, The SOI structure of FIG. 6 remains for further processing to form various semiconductor structures.

The demonstrated etch rate and selectivity of this etch stop/etchant system is effective for thinning processes requiring the removal of 2 μm of silicon with a thickness uniformity of 20 nm. For more details on various etches that can be used with this invention, in addition to alternative bonding methods and alternative mechanical substrates, U.S. Pat. No. 4,601,779 issued to Abernathey et al. on July 22, 1986 is herein incorporated by reference.

Figure 7:
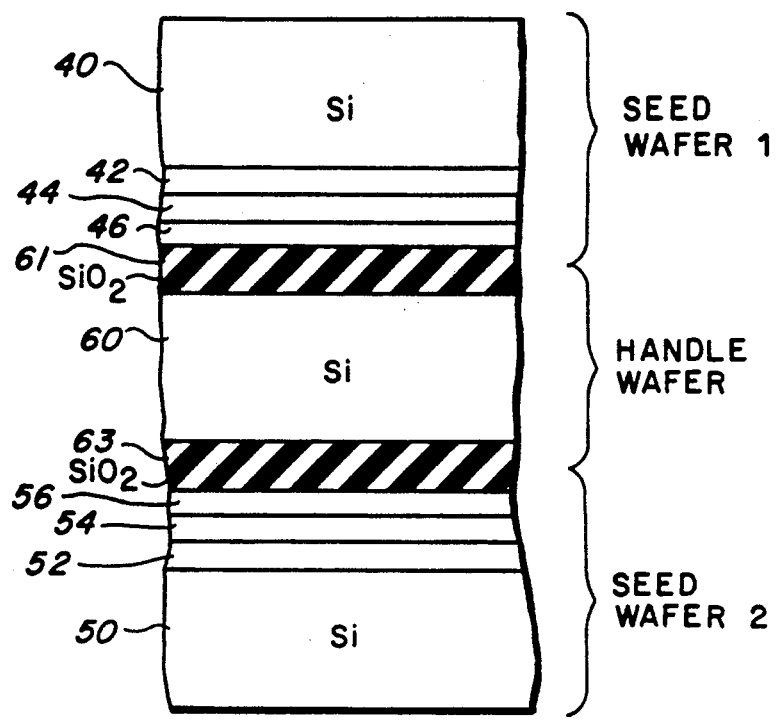
FIG. 7 is an illustration of a second embodiment of the invention.
Figure 8:
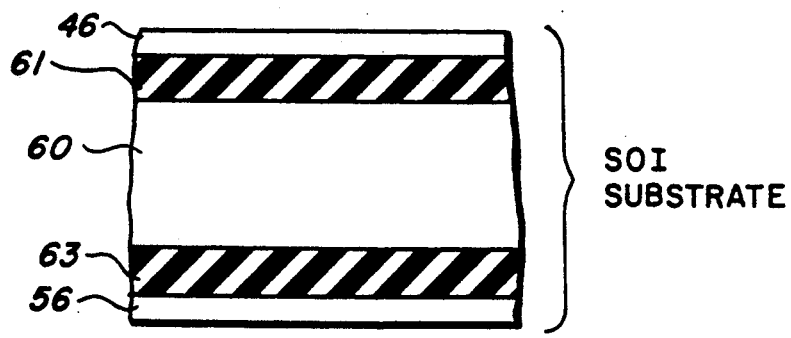
FIG. 8 is an illustration of the resulting SOI structure of the second embodiment of the invention.

In a second embodiment illustrated in FIG. 7, SOI wafers can be stacked to produced three-dimensional integrated circuits having increased density. A first seed wafer includes a Si region 40 which has grown thereon, a buffer layer 42, an silicon-germanium etch-stop layer 44, followed by a silicon cap layer 46. A second seed wafer includes a Si region 50 which has grown thereon, a buffer layer 52, a silicon-germanium etch-stop layer 54, followed by a silicon cap layer 56. A substrate wafer includes a silicon wafer 60 which is oxidized to form insulating regions 61 and 63 of $SiO_2$ on both of its surfaces. The first seed wafer is bonded to insulating region 61 of the substrate wafer and the second seed wafer is bonded to insulating region 63 of the substrate wafer. The processes used to fabricate the structure is the same as used in the preferred embodiment. The only difference being the formation of a second seed Wafer and subsequent bonding to a second oxidized region of the substrate wafer. After the bonding process described above, the structure of FIG. 7 is sequentially etched as described above in regard to FIGS. 1-6 of the preferred embodiment to remove layers 40, 42, 44, 50, 52, 54 and leave the structure of FIG. 8 for further processing.

Figure 9:
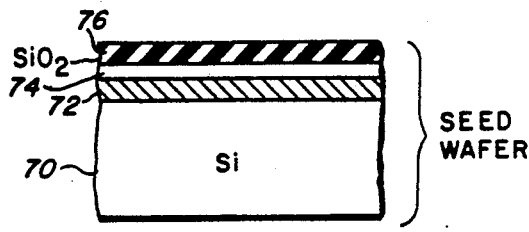
FIGS. 9 and 10 are illustrations of a seed and handle wafer of a third embodiment of the invention.
Figure 10:
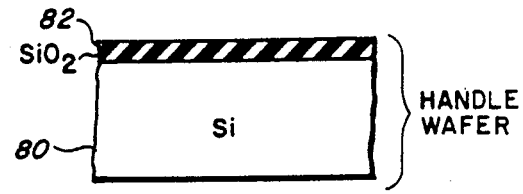
Figure 11:
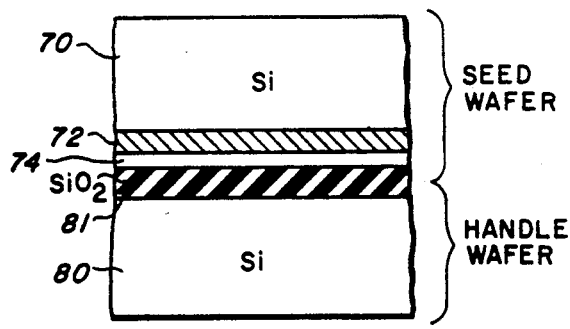
FIG. 11 is an illustration of the seed and handle wafers of the third embodiment after being bonded together.
Figure 12:
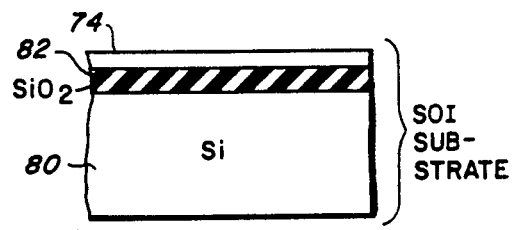
FIG. 12 is an illustration of the resulting SOI structure of the third embodiment.

In a third embodiment, as illustrated in FIG. 9, the silicon-germanium etch stop layer 72 is formed by implanting germanium ions into a silicon substrate 70. The implanted ions could also be tin or lead to form silicon-tin or silicon-lead alloys. The germanium ion dose should be sufficient to give an alloy of the proportions as described in the first embodiment, and the germanium ion energy should be selected for the proper penetration depth for the desired epilayer thickness. The processing steps illustrated in FIGS. 10-12 are the same as those for the first embodiment as illustrated in FIGS. 1-6 and described above. Therefore, these processing steps will not be repeated here.

Figure 13:
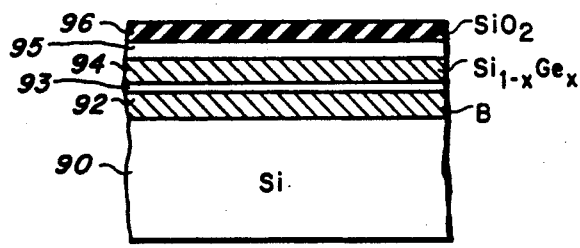
FIG. 13 is an illustration of a seed wafer of a fourth embodiment of the invention.

In a fourth embodiment, illustrated in FIG. 13, a combination of two separate etch stop layers could be grown into a silicon substrate. For example, boron could be implanted, into a silicon substrate 90, to form a first etch stop layer 92, followed by implantation of germanium ions to form a second etch stop layer 94 of a strained silicon-germanium alloy. The boron ions would be implanted at an energy sufficient to form the first etch stop layer 92 below the silicon-germanium etch stop layer 94. The boron and germanium ions could be implanted before or after formation of oxide layer 96. Alternatively, the separate etch stop layer 92 and 94, could be grown epitaxially by MBE or CVD, with a spacer layer 93 separating the two etch stop layers. Alternatively, one etch stop layer could be grown epitaxially and the other etch stop layer could be implanted or vice versa. This provides extraordinarily high selectivity due to the boron etch stop layer 92, i.e. the ratio of the etch rate of the silicon layer 90 and the etch stop layer 92. Also, by using the spacer 93 and the silicon-germanium etch stop layer 94, any boron tail will be minimized. After the structure of FIG. 13 is processed, the silicon layer 90 and etch stop layer 92 would be removed as shown in U.S. Pat. No. 4,601,779 to Abernathey. Layers 93 and 94 would be removed as shown and described in the first embodiment of the invention.

What has been described is a process for fabricating thin film silicon-on-insulator wafers which uses a silicon germanium alloy as an etch stop in bond-and-etchback silicon-on-insulator technology.

With this process as described in the preferred embodiment, silicon films can be grown as thin as desired utilizing the etch stop $Si_{1-x}Ge_x$ alloy. The etch stop is grown into the material, thereby enabling the growth of a defect free device region since the implantation of the etch stop is unnecessary.

Germanium is not an electrically active dopant in silicon, therefore device quality is not limited by the presence of carrier scattering centers from ionized dopants. Complementary devices can therefore be built without compensation. Furthermore, the back channel can be radiation hardened for aerospace and defense technologies in a straight forward manner, and by existing technologies.

An alternative use for this technology includes the fabrication of silicon membranes for use as x-ray masks.

Obviously, numerous modifications and variations of the present invention are possible in light of the above teachings. It is therefore to be understood that within the scope of the appended claims, the invention may be practiced otherwise than an specifically described herein.

What is claimed as new and is desired to be secured by letters patent in the United States is:

1. A method of forming a thin semiconductor layer upon which semiconductor structures can be subsequently formed, comprising the steps of:
    selecting one or more silicon substrates;
    forming an etch-stop layer upon at least one of said one or more silicon substrates, said etch-stop layer comprising an alloy of silicon and one other Group IV element;
    forming a silicon cap layer upon said etch-stop layer;
    bonding said silicon cap layer to a mechanical substrate;
    removing said at least one of said one or more silicon substrates and said etch stop layer without removing underlaying portions of said silicon cap layer, whereby said underlaying portions of said silicon cap layer remain on said mechanical substrate to form said thin semiconductor layer.

2. The method as recited in claim 1, said etch-stop layer comprises a silicon-tin alloy.

3. The method as recited in claim 1, said etch-stop layer comprises a silicon-lead alloy.

4. The method as recited in claim 1, wherein aid step of bonding said silicon cap layer to said mechanical substrate comprises the steps of:
    forming a layer of silicon dioxide on an exposed surface of said silicon cap layer;
    forming a layer of silicon dioxide on an exposed surface of said mechanical substrate;
    bringing said layers of silicon dioxide into contact; and heating said silicon dioxide layers in order to form a bond therebetween.

5. The method as recited in claim 1, wherein said step of bonding said silicon cap layer to said mechanical substrate comprises the steps of:
forming a layer of silicon dioxide on an exposed surface of said silicon cap layer;
bringing said layer of silicon dioxide and said mechanical substrate into contact; and
heating said silicon dioxide layer and said mechanical substrate in order to form a bond therebetween.

6. The method as recited in claim 1, wherein said step of bonding said silicon cap layer to said mechanical substrate comprises the steps of:
forming a layer of silicon dioxide on an exposed surface of said mechanical substrate;
bringing said layer of silicon dioxide and said silicon cap layer into contact; and
heating said silicon dioxide layer and said silicon cap layer in order to form a bond therebetween.

7. The method as recited in claim 1, wherein said step of removing said at least one of said one or more silicon substrates and said etch-stop layer comprises the steps of:
mechanically removing a portion of said at least one of said one or more silicon substrates;
selectively etching remaining portions of said at least one of said one or more silicon substrates and a part of said etch-stop layer with a selective etchant;
etching the remaining portion of said etch-stop layer with a second etchant which selectively removes said etch-stop layer.

8. The method as recited in claim 1 wherein:
said one or more substrates is at least a first and a second substrate, said first substrate is said at least one of said one or more silicon substrates, said etch stop layer is a first etch stop layer, said silicon cap layer is a first silicon cap layer, said method further comprising the steps of:
forming an additional etch-stop layer upon said second silicon substrate, said additional etch-stop layer comprising a silicon-germanium alloy;
forming an additional silicon cap layer upon said additional etch-stop layer;
bonding said second silicon substrate to the opposite surface of said mechanical substrate from said first silicon substrate;
removing said first and second silicon substrates and said first and second strained etch stop layers without removing underlaying portions of said first and second silicon cap layers, whereby said underlaying portions of said silicon cap layers remain on both surfaces of said mechanical substrate to form the thin semiconductor layers.

9. The method recited in claim 1, wherein the step of forming said etch-stop layer comprises the step of:
implanting Group IV ions, other than Silicon, into said silicon layer in order to form a buried silicon-Group IV alloy layer therein.

10. The method as recited in claim 9, wherein said ions comprise tin ions, such that said buried layer is comprised of a silicon-tin alloy.

11. The method as recited in claim 9, wherein said ions comprise lead ions, such that said buried layer is comprised of a silicon-lead alloy.

12. The method of claim 1, wherein said etch-stop layer is a first etch-stop layer and wherein the step of forming said etch-stop layer comprises the further steps of:
forming a spacer layer on said first etch-stop layer;
forming a second etch-stop layer upon said spacer layer, said second etch-stop layer comprising a silicon-germanium alloy; and
forming a silicon cap layer upon said second etch-stop layer; and wherein
said removing step removes said silicon substrate and said first and second etch stop layers without removing underlaying portions of said silicon cap layer.

13. The method as recited in claim 1 wherein said etch-stop layer comprises a silicon-germanium alloy.

14. The method as recited in claim 13, wherein said silicon-germanium alloy has a composition of $Si_{1-x}Ge_x$, wherein $x=0.1-0.5$.

15. The method as recited in claim 9, wherein said ions comprise Germanium ions, such that said buried layer is comprised of a silicon-Germanium alloy.

16. The method recited in claim 1, wherein the step of forming said etch-stop layer comprises depositing a layer of an alloy of silicon and another Group IV element.

17. The method recited in claim 16 wherein said alloy is a silicon-germanium alloy.

18. The method recited in claim 16 wherein said alloy is a silicon-tin alloy.

19. The method recited in claim 16 wherein said alloy is a silicon-lead alloy.

* * * * *

UNITED STATES PATENT AND TRADEMARK OFFICE
CERTIFICATE OF CORRECTION

PATENT NO. : 5,013,681
DATED : May 7, 1991
INVENTOR(S) : David J. Godbey, Harold L. Hughes and Francis J. Kub It is certified that error appears in the above-identified patent and that said Letters Patent is hereby corrected as shown below:

Title page, Item 57, line 4 after "strained" correct "$Si_{1-x}Fe_x$" to --$Si_{1-x}Ge_x$--.

Signed and Sealed this

Fourteenth Day of June, 1994

*Attest:*

BRUCE LEHMAN

*Attesting Officer*     *Commissioner of Patents and Trademarks*